United States Patent

[11] 3,628,999

[72] Inventors Frederick W. Schneble, Jr. Oyster Bay; John F. McCormack, Roslyn Heights; Rudolph J. Zeblisky, Hauppauge; John Duff Williamson, Miller Place; Joseph Polichette, Farmingdale, all of N.Y.

[21] Appl. No. 16,847
[22] Filed Mar. 5, 1970
[45] Patented Dec. 21, 1971
Continuation-in-part of application Ser. No. 561,123, June 28, 1966, now abandoned, which is a continuation-in-part of application Ser. No. 598,444, Dec. 1, 1966, now abandoned, and a continuation-in-part of 701,817, Jan. 29, 1968, now abandoned, and a continuation-in-part of 811,142, Mar. 27, 1969, now abandoned. This application Mar. 5, 1970, Ser. No. 16,847

[54] PLATED THROUGH HOLE PRINTED CIRCUIT BOARDS
10 Claims, 3 Drawing Figs.

[52] U.S. Cl. .................................................. 117/212, 29/625, 117/6, 117/218, 174/68.5, 317/101
[51] Int. Cl. .................................................. B44d 1/18
[50] Field of Search .................................................. 117/212, 6, 218, 38; 29/625; 174/68.5; 317/101 A

[56] References Cited

UNITED STATES PATENTS

| | | | |
|---|---|---|---|
| 3,146,125 | 8/1964 | Schneble, Jr. et al. | 117/212 |
| 3,171,756 | 3/1965 | Marshall | 117/212 |
| 3,218,214 | 11/1965 | Polley | 117/6 X |
| 3,268,653 | 8/1966 | McNutt | 174/68.5 |
| 3,269,861 | 8/1966 | Schneble, Jr. et al. | 117/212 |
| 3,390,012 | 6/1968 | Haberecht | 117/6 X |
| 3,485,664 | 12/1969 | Ernsthausen | 117/38 X |

*Primary Examiner*—Alfred L. Leavitt
*Assistant Examiner*—Alan Grimaldi
*Attorney*—Morgan, Finnegan, Durham and Pine

ABSTRACT: This invention relates to new and useful plated through hole printed circuit boards and more particularly to plated through hole printed circuit boards having highly reliable solder joints, and improved methods for producing such boards which include the application of a temporary, strippable solder mask together with a permanent solder mask.

A B C D E F G H

INVENTORS
FREDERICK W. SCHNEBLE, JR.
JOHN F. McCORMACK
BY RUDOLPH J. ZEBLISKY
JOHN DUFF WILLIAMSON
JOSEPH POLICHETTE
Morgan, Finnegan, Durham & Pine
ATTORNEYS INVENTORS
FREDERICK W. SCHNEBLE, JR.
JOHN F. McCORMACK
RUDOLPH J. ZEBLISKY
JOHN DUFF WILLIAMSON
JOSEPH POLICHETTE BY Morgan, Finnegan, Durham & Pine
ATTORNEYS INVENTORS
FREDERICK W. SCHNEBLE, JR.
JOHN F. McCORMACK
RUDOLPH J. ZEBLISKY
JOHN DUFF WILLIAMSON
JOSEPH POLICHETTE
BY Morgan, Finnegan, Durham & Pine
ATTORNEYS

PLATED THROUGH HOLE PRINTED CIRCUIT BOARDS

This application is a continuation-in-part of applications: Ser. No. 561,123, filed June 28, 1966 and now abandoned; and Ser. Nos. 598,444, 701,817 both now abandoned and 811,142 filed Dec. 1, 1966, Jan. 29, 1968 and Mar. 27, 1969, respectively; all four of which applications in turn disclosed subject matter contained in Ser. No. 218,656, filed Aug. 22, 1962, now U.S. Pat. No. 3,259,559, which in turn disclosed subject matter contained in Ser. No. 831,407, filed Aug. 3, 1959, by Frederick W. Schneble, John F. McCormack, Rudolph J. Zeblisky and Joseph Polichette, and now abandoned; and Ser. No. 26,401, filed May 3, 1960, and now U.S. Pat. No. 3,095,309 by Rudolph John Zeblisky, John Francis McCormack, John Duff Williamson and Frederick W. Schneble, Jr.

SUMMARY

In copending application Ser. No. 598,444, there are described improved plated through hole printed circuit boards having solder joints of enhanced reliability. Such boards include plated holes having metallized surface areas in the form of pads or lands which are integral with the hole wall plating, but which project away from and/or are spaced from the plane of the conductor lines making up the circuit pattern.

Heretofore, in the production of such boards, for reasons not completely understood, difficulty has been experienced in achieving reliable formation of such metallized surface pads or lands around the plated holes. Thus, with processes of the type described in the identified copending application Ser. No. 598,444, formation of the metallized surface pads or lands tends to be hit or miss, thereby resulting in a high reject ratio with consequent interference with production scheduling. Also, stringent control procedures are required in such manufacturing operations in order to first identify and then cull out boards in which the surface pads or lands have not been properly produced.

If boards of the type described are to be economically competitive with conventional plated through hole boards, a way has to be found to insure certain production of the metallized surface pads or lands. Boards which do not possess structurally reliable metallized surface pads or lands are extremely difficult to solder plate. Accordingly, such boards tend to have poor solder joints with all of the disadvantages connoted by such a feature.

According to this invention, it has been discovered that production of structurally reliable, metallized surface pads or lands on boards of the type described is assured by use of an adhesive coated, mechanically strippable temporary mask over the permanent solder mask during the formation of the plated through holes.

Such masks comprise a plastic or resinous sheet or film coated on one surface with an adhesive composition, i.e., a pressure sensitive adhesive. Among such materials may be mentioned pressure sensitive adhesive coated tetrafluoroethylene (Teflon), fluorinated ethylene propylene, polyethylene, polypropylene, and the like.

The substantially certain attainment of metallized surface pads or lands by use of such a temporary, preferably mechanically strippable mask was unpredictable and permits the superior plated through hole printed circuit boards described herein and in copending application Ser. No. 598,444 to be produced in a manner such that they are competitive with the conventional plated through hole boards of the prior art.

DETAILED DESCRIPTION

Figure 1:
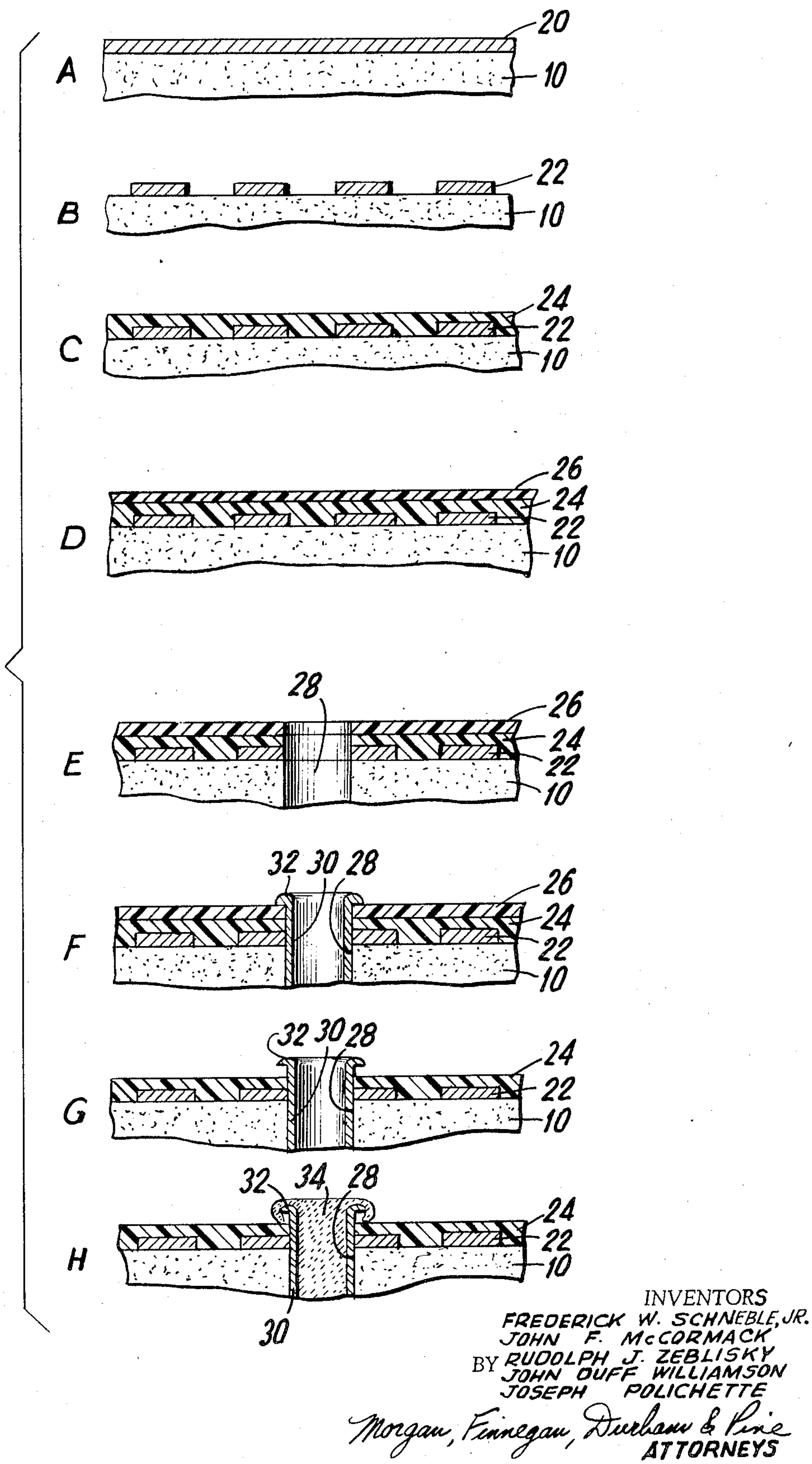

Heretofore, in producing circuit boards which have a high circuit density per unit area, difficulty has been experienced due to the fact that the holes in such boards: (1) tend to have an extremely small diameter; and (2) tend to be extremely closely spaced, at least in some portions of the circuitry. In conventional practice, a plated through hole board is formed with a circuit on one or more exposed surfaces, and then a registered solder mask is printed over the circuit pattern, to leave holes and lands or pads (i.e., small areas on the surface surrounding the hole) as well as fingers (i.e., terminal contact areas) exposed. Subsequently, the circuit is solder plated as by dipping in a solder bath to plate solder on the lands and fingers and in the holes. The mask protects the major portion of the circuit from the solder and thus guards against short circuiting by the solder of the conductor lines making up the circuit pattern.

In such conventional circuits, when the circuit density is high, it is extremely difficult to print a registered solder mask so as to provide exposed land or pad areas surrounding the holes without some soldering mask accidentally lodging on the barrel of the holes.

Conventional registered, printed solder masks have other disadvantages. Thus, even when great precautions are taken in printing the solder mask on high density circuit boards of the type described, there is a good possibility of the masks breaking down in part, thereby causing the solder to bridge from one land to another, or from one conductor line to another, which in turn results in short circuiting of the finished board. Because in order to maintain fine printing tolerances in such boards dangerously thin prints are used, the solder mask tends to block the holes, thereby preventing proper soldering.

The aforesaid disadvantages of conventional plated through hole boards are substantially eliminated by practice of the present invention.

An object of this invention is to provide procedures for making rugged, durable and reliable plated through hole printed circuit boards.

A further object of this invention is to make printed circuit boards, including one-layer, two-layer and multilayer boards which are protected from solder bridging during assembly and rework by a nonregistered solder mask.

A further object of this invention is to provide procedures for making printed circuit boards, including one-layer, two-layer and multilayer boards, which are provided with conductive passageways capable of forming reliable solder joints with the printed conductor lines of the circuit pattern.

An additional object of this invention is to provide printed circuit boards, including high density one-layer, two-layer and multilayer boards, which are provided with conductive passageways, or, as more commonly referred to, plated through holes, characterized by exposed pads or projections integral with the holes which are at least in part nonplanar with and/or vertically spaced from the conductor line or lines making up the printed circuit pattern.

Still a further object of this invention is to provide printed circuit boards having plated through holes capable of forming reliable solder joints whose conductors are protected from solder bridging during assembly and rework by a nonregistered, permanent solder mask and whose holes comprise pads or lands which are nonplanar with the conductor line or lines of the circuit pattern.

Other objects and advantages of the invention will be set forth in part herein and in part will be obvious herefrom or may be learned by practice with the invention, the same being realized and attained by means of the instrumentalities and combinations pointed out in the appended claims.

As will be clear from the following description, there may be used in the manufacture of the circuit boards of this invention certain catalytic blanks and compositions which are inherently receptive to the deposition of electroless metal. Alternatively, there may be used conventional seeding and/or sensitizing solutions which render insulating bodies catalytic to the reception of electroless metal.

Among the materials which may be used as the printed circuit base may be mentioned plastic or resin insulating bases. Thermosetting resins, thermoplastic resins and mixtures of the foregoing may be used.

Among the thermoplastic resins may be mentioned the acetal resins; acrylics, such as methyl acrylate; cellulosic resins, such as ethyl cellulose, cellulose acetate, cellulose propionate, cellulose acetate butyrate, cellulose nitrate, and the like; chlorinated polyethers; nylon; polyethylene; polypropylene; polystyrene; styrene blends, such as acrylonitrile styrene copolymers and acrylonitrile-butadiene styrene copolymers; polycarbonates; polychlorotrifluoroethylene; and vinyl polymers and copolymers, such as vinyl acetate, vinyl alcohol, vinyl butyral, vinyl chloride, vinyl chloride-acetate copolymer, vinylidene chloride and vinyl formal.

Among the thermosetting resins may be mentioned allyl phthalate; furane; melamine-formaldehyde; phenol formaldehyde and phenol-furfural copolymer, alone or compounded with butadiene acrylonitrile copolymer or acrylonitrile-butadiene styrene copolymers; polyacrylic esters; silicones; urea formaldehydes; epoxy resins; allyl resins, glyceryl phthalates; polyesters; and the like.

The insulating bases need not be organic. Thus, it could be made of inorganic insulating materials, e.g., inorganic clays and minerals such as ceramic, ferrite, carborundum, glass, glass bonded mica, steatite and the like.

The term "catalytic base" as used herein generically refers to any insulating material which is catalytic to the reception of electroless metal, regardless of shape or thickness, and includes thin films and strips as well as thick substrata. The term "catalytic adhesive", also used herein, refers to an insulating resinous material with adhesive capability which is catalytic to the reception of electroless metal.

The catalytic bases and catalytic adhesives referred to herein are organic or inorganic materials of the type described which have dispersed therein or thereon an agent which is catalytic to the reception of electroless metal, i.e., an agent which is capable of reducing the metal ions in an electroless metal deposition solution to metal.

Conductive materials, i.e., metals, may be used as the catalytic agent. Preferred catalytic agents are metals selected from Groups VIII and IB of the Periodic Table of Elements, such as nickel, gold, silver, platinum, palladium, rhodium copper and iridium. Compounds of such metals, including salts and oxides thereof, may also be used.

Typical formulations for catalytic insulating adhesives and catalytic insulating bases suitable for use herein are given in the applications and patents identified hereinabove.

If desired, the base material used for the boards of this invention need not be catalytic. In this embodiment, the walls of the holes, following formation, must be suitable treated to sensitize them to the electroless deposition of metal. Thus, the lateral walls surrounding the holes could be seeded or sensitized by sequential treatment with aqueous solutions of stannous tin ions, or amine boranes, e.g., dialkyl amine boranes, such as dimethylamine borane, morpholine borane, isopropylamine borane, and the like; or alkali borohydrides, such as sodium or potassium borohydride, followed by or preceded by treatment with an aqueous solution of precious metal ions, e.g., palladium. For example, one such treatment involves immersing the perforated insulating, noncatalytic base material first in an aqueous solution of stannous chloride, followed by washing, after which the substratum is immersed in an acidic aqueous solution of palladium chloride. Seeding and sensitizing may also be accomplished by soaking the noncatalytic insulating base material in a single aqueous solution comprising a mixture of stannous tin ions and precious metal ions, such as palladium ions, as described in U.S. Pat. No. 3,001,920. The precious metals which may be used in such seeding solutions include platinum, gold, rhodium, osmium and iridium, in addition to palladium. Mixtures of such precious metals may also be used.

Regardless of whether the insulating base material is inherently catalytic, or treated to render it catalytic, the catalyzed surfaces thereof, e.g., hole walls, may be metallized electrolessly by contacting the board with a variety of electroless metal solutions, such as copper, nickel and gold electroless metal solutions. Such plating solutions are well known in the art and are capable of autocatalytically depositing the identified metals on insulating surfaces catalyzed as described without the use of electricity.

Electroless copper solutions which may be used are described in U.S. Pat. No. 3,095,309, the description of which is incorporated herein by reference. Conventionally, such solutions comprise a source of cupric ions, e.g., copper sulfate, a reducing agent for cupric ions, e.g., copper sulfate, a reducing agent for cupric ions, e.g., formaldehyde, a complexing agent for cupric ions, e.g., tetrasodium ethylenediaminetetraacetic acid, and a pH adjuster, e.g., sodium hydroxide.

Electroless nickel baths which may be used are described in Brenner, Metal Finishing, Nov. 1954, pages 68 to 76, incorporated herein by reference. They comprise aqueous solutions of a nickel salt, such as nickel chloride, an active chemical reducing agent for the nickel salt, such as the hypophosphite ion; and a complexing agent, such as carboxylic acids and salts thereof.

Electroless gold plating baths which may be used are disclosed in U.S. Pat. No. 2,976,181, hereby incorporated herein by reference. They contain a slightly water soluble gold salt, such as gold cyanide, a reducing agent for the gold salt, such as the hypophosphite ion, and a chelating or complexing agent, such as sodium or potassium cyanide. The hypophosphite ion may be introduced in the form of the acid and salts thereof, such as the sodium, calcium and the ammonium salts. The purpose of the complexing agent is to maintain a relatively small portion of the gold in solution as a water soluble gold complex, permitting a relatively large portion of the gold to remain out of solution as a gold reserve. The pH of the bath will be about 13.5, or between about 13 and 14, and the ion ratio of hypophosphite radical to insoluble gold salt may be between about 0.33 and 10 to 1.

Utilizing the electroless metal baths of the type described, very thin conducting metal films may be laid down. Ordinarily, the metal films superimposed by electroless metal deposition will range from 0.1 to 7 mils in thickness, with metal films having a thickness of even less than 0.1 being a distinct possibility.

Figure 2:
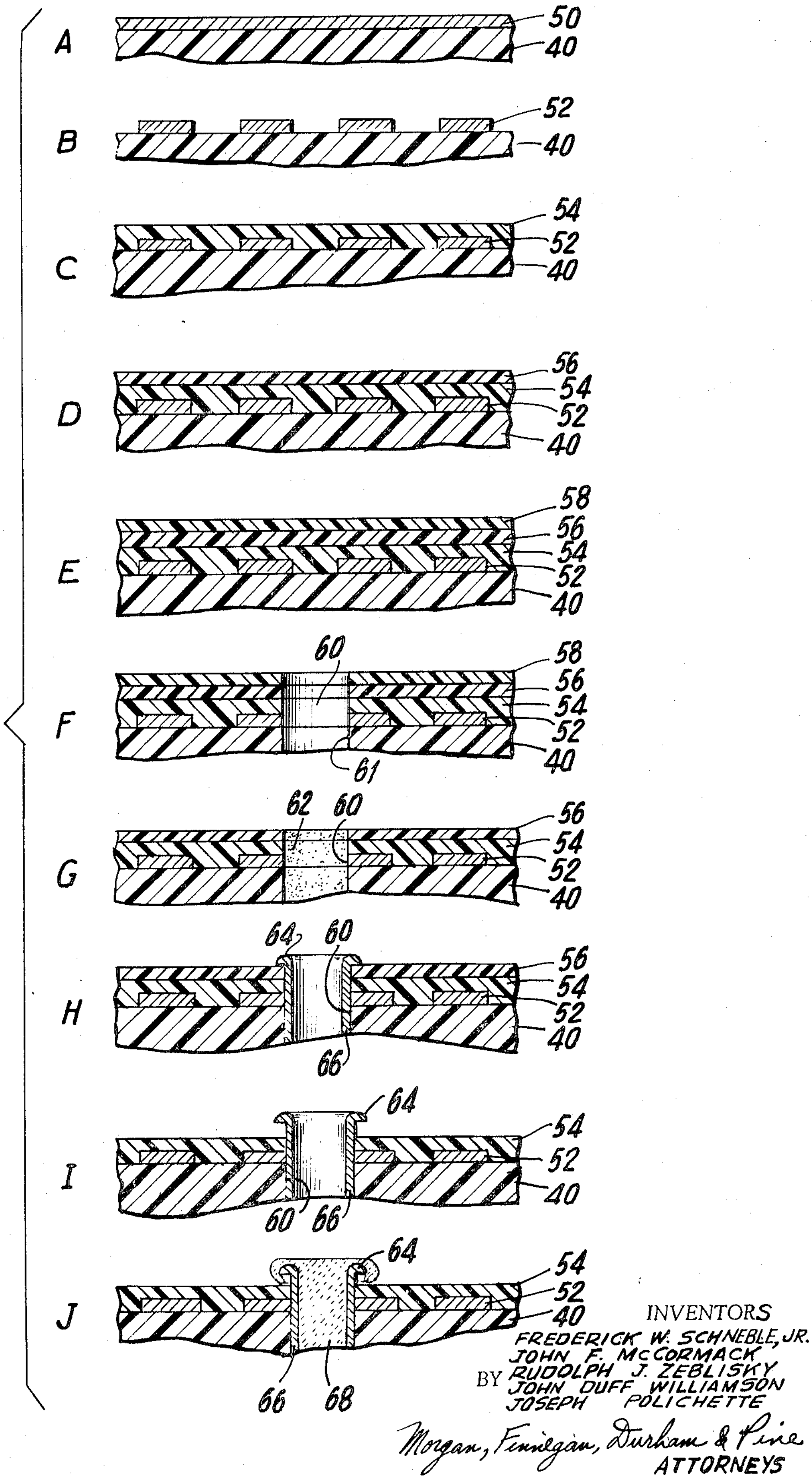
Figure 3:
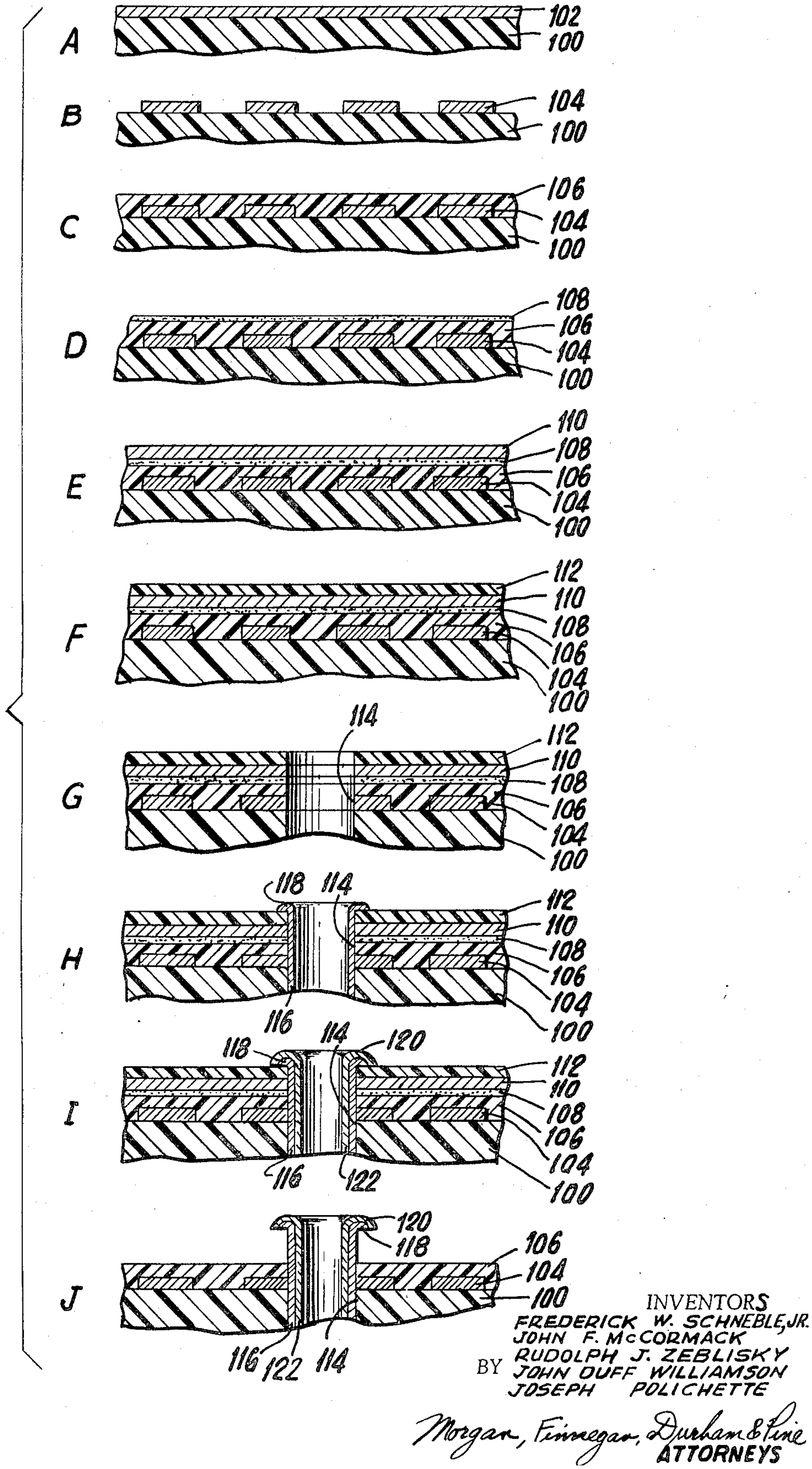

FIGS. 1–3 illustrate alternative procedures which can be used to produce printed circuit boards according to the present invention.

FIG. 1 illustrates the steps to be used in one manufacturing procedure for producing plated through hole boards from catalytic boards of the type described supra. For simplicity, only one surface of the board is shown. Obviously, if a two-sided board were desired, both surfaces would be treated as shown in FIG. 1. In FIG. 1A is shown a blank which comprises a catalytic base 10 of the type described herein, having bonded thereto a thin film of metal 20. At B in FIG. 1, a circuit pattern 22 has been produced on base 10 by following standard print and etch principles well known in the art. In FIG. 1C, the circuit pattern 22 has been covered completely with a nonregistered solder mask 24. In FIG. 1D, an adhesive coated, mechanically strippable temporary plastic mask 26 has been superimposed on and applied to permanent mask 24. Typical of the material which may be used as the mechanically strippable mask 26 is the commercially available product Poly Spot Stik, an adhesive coated polyethylene film. In FIG. 1E, holes 28 extending through masks 24 and 26 and into base 10 have been provided in the board. In FIG. 1F, the board has been subjected to an electroless metal solution to deposit a coating of electroless metal 30 on the walls surrounding the holes 28. Electroless deposition is permitted to continue until the metal deposit 30 on the walls of holes 28 creeps up to and preferably over the edges of the temporary mask 26 to form exposed surface lands or pads 22 which surround the holes 28. These surface lands or pads 32 are spaced from and are nonplanar with vertically spaced conductor lines 22. Next, the temporary mask 26 is mechanically stripped, to leave a board having a surface of the type depicted in FIG. 1G. When subjected to a solder bath, the board of FIG. 1G will receive solder on the wall plating 30, as well as on the pads or lands 32, as shown in FIG. 1H, at 34.

The surface lands or pads 32 are essential to insure good solderability of the boards. Thus, absent such lands or pads, it is difficult to wave or dip solder the plated hole walls.

During electroless metal deposition, the electroless metal deposit on the walls of the holes will grow simultaneously in three directions, vertically as well as laterally, and will therefore tend to creep up on and coat the walls of the insulating masks 24 and 26 surrounding the hole, even though the masks themselves are not catalytic to the reception of electroless metal.

By decreasing the thickness of the insulating masks 24 and 26, or by increasing the thickness of the deposit of metal on the hole walls as by increasing the rate of time of electroless deposition, the deposit on the hole walls is made to creep first vertically up to the surface of the temporary mask 26 and then horizontally over the surface so as to form metallized surface areas in the form of pads or lands 32 surrounding the holes on the surface of the mask 26.

Other parameters which may be varied to insure formation of the surface lands or pads 32 include cleaning cycles and surface tension of the plating solutions. For example, the presence of wetting agents in the electroless metal solutions reduces the tendency of the deposit to creep up the wall of the insulating masks 24, 26 surrounding the hole.

FOr solderability, it is essential that the parameters be correlated such that the plating on the hole wall grows up to and preferably over the lip of temporary mask 24 surrounding the holes to form the land or pad 32. Otherwise, when the board is exposed to molten solder, the solder will not penetrate the hole, and, as a result, the plating on the hole wall will be nonuniformly or imperfectly solder-coated. Although the reason for the lack of solderability of boards which do not possess lands or pads of the type depicted at 32 in FIGS. 1F and 1H is not clearly understood, it is believed that it can be attributed to the fact that the mask 24 on such boards acts as a heat barrier which insulates the plating on the hole wall from the hot solder. As a result, the wall plating, upon exposure of the board to molten solder, remains comparatively cool, compared with the hot solder. This difference in temperature sets up forces, e.g., convection currents, which retard entry of the hot solder into the hole. More important, probably, is the fact that the comparatively "cool," nonheat conducting edge of the mask surrounding the hole cools the solder in contact therewith, thereby inhibiting the flow characteristics of the solder. With boards possessing pads or lands 32, however, the pad or land is heated immediately upon contact of the board with the molten solder bath, and in turn immediately conducts heat from the solder bath to the interior portion of the wall plating, thereby causing the wall plating also to be heated. The heated plating, in turn, causes the hot solder in contact therewith to remain hot and to retain its flow characteristics, and to thereby flow into the holes and coat the wall plating substantially uniformly over the cross section of the board, thereby insuring reliable solder joints.

Thus, when the boards of this invention, e.g., those shown in FIG. 1G, are exposed to molten solder, a solder coat 34 forms uniformly over pads 32 and in the holes, as shown in FIG. 1H. Note that the solder mask 24 protects the circuit lines 22 during soldering and any subsequent rework operation.

The temporary, strippable mask 26 facilitates formation of the pads or lands 32 in a way not completely understood. After the temporary mask 32 is stripped, the permanent solder mask 24 takes over and eliminates certain problems heretofore encountered in the manufacture of high-density printed circuits. When the circuit board of FIG. 1G is subjected to a solder bath, solder deposits only on the electroless metal deposit 32 on the walls surrounding hole 28 and on the exposed pads 32 as shown at 32 in FIG. 1H. The mask 24 insures that no solder deposits on the surface of the circuit board itself. Also note that the lands 32 are in a different plane from that of the conductor lines 22. This arrangement substantially eliminates any possibility of solder bridging.

The printed pattern may be formed on the metal clad blanks of this invention is a variety of ways, e.g., by use of photographic printing techniques, silk screen printing, and the like.

Regardless of the type of printing employed, it will be understood that either a positive or a negative image of the desired conducting patterns may be imposed on the base, with suitable modifications to insure that the final conductive pattern desired is ultimately obtained.

Although suitable for the manufacture of a wide variety of printed circuit boards, the procedure of FIG. 1 has exceptional advantages when used to produce high-density plated through hole printed circuit boards. Such a technique represents substantially the only practical way for achieving even plating on the walls of small, high aspect ratio (small diameter with respect to the thickness of the part) holes. Heretofore, using conventional techniques and materials, the plating on the hole walls has tended to be quire uneven.

The nonregistered permanent solder mask concept avoids the problems heretofore described of printing a permanent insulating mask. As is brought out in copending application Ser. No. 598,444, it is very difficult using modern printing concepts to print a registered permanent solder mask on boards on which the hole centers are spaced a distance less than 125 mils. The consensus in the art is that when the holes are less than 100 mils apart, it is practically impossible to print a registered permanent solder mask. Practice of the present invention eliminates such problems.

Use of the catalytic insulating bases as blanks in the manufacture of printed circuit boards as described in FIG. 1, enhances the reliability of the circuit boards to a substantial extent. With such boards, the hole walls are ordinarily receptive to the reception of electroless metal regardless of where the holes are placed. Further, since the catalytic agent is an integral part of and evenly dispersed throughout the insulating base, the chances of achieving dead spots on the hole walls is infinitesimal. In conventional seeding and sensitizing techniques, there is a probability of the "seed" dropping off the hole walls, thereby causing dead spots which are not plated when the wall is exposed to an electroless metal deposition solution.

However, conventional seeding techniques and other methods may be used in the practice of this invention as will now be described.

FIG. 2 illustrates an alternative procedure for manufacturing printed circuit boards of the type depicted in FIG. 1 from noncatalytic base materials using seeding and sensitizing systems. Here again, for simplicity, only one side of the board is considered. In practice, if a two-sided board were desired, both surfaces would be treated as described in FIG. 2.

In FIG. 2A is shown a noncatalytic insulating base 40 clad on at least one surface with a thin metal film 50. In FIG. 2B, circuit pattern 52 has been imposed on the base by a standard print and etch technique. In FIG. 2D, a relatively thick, permanent solder mask 54 has been superimposed on the circuit pattern 52. Next, a first mechanically strippable adhesive coated temporary mask 56 and then a second mechanically strippable adhesive coated temporary mask 58 are superimposed over the permanent mask 54 in sequence, as shown, respectively, in FIGS. 1D and 1E. Each of the masks 56 and 58 may be made of the Poly Spot Stik material described above.

Next, holes 60 (FIG. 2F) defining cross overs are provided in the base and the base is treated with a seeding and sensitizing solution or solutions to render the walls 61 of the holes 60 catalytic to the reception of electroless metal. The sensitizing and seeding solutions will of course also sensitize the exposed surface of strippable mask 58. Accordingly, mask 58 is next stripped, thereby exposing the surface of temporary mask 56, which is not catalytic to the reception of electroless metal. FIG. 2G shows the condition of the board at this stage, wherein the hole walls are catalytic as shown at 62, but the surface of temporary mask 56 is not. Next, the base is exposed to an electroless metal solution to deposit a thin film of electroless metal 66 on the walls of the holes 60 as shown in FIG. 2H. Electroless deposition is continued until the metal deposit builds up on areas of mask 56 surrounding the holes as shown at 64 in FIG. 2H. Finally, the temporary mask 56 is stripped.

The final board has the appearance shown in FIG. 2I. It will be noted that the permanent, nonregistered resin mask 54 coats the entire surface on the top and bottom of the board, leaving only the plated through hole 60 with surrounding lands 64 exposed.

The following is a typical specific procedure which may be used in practicing the process illustrated in FIG. 2:

1. Print resist and etch noncatalytic base stock copper clad on both sides;
2. Remove resist;
3. Apply a permanent epoxy mask to both surfaces of the base;
4. Apply a temporary, strippable adhesive mask, Poly Spot Stik, on both surfaces of the permanent mask;
5. Apply a second temporary, strippable adhesive mask, Poly Spot Stik, on both surfaces of the first temporary mask;
6. Drill all holes;
7. Immerse base in concentrated $H_2SO_4$ for about 30 seconds;
8. Neutralize in Altrex solution for about 1 minute;
9. Immerse in hydrochloric acid solution for about 2 minutes;
10. Seed and sensitize, and then wash;
11. Remove the second temporary mask;
12. HCl dip;
13. Immerse in electroless copper solution to plate the hole walls and form the pads surrounding the holes;
14. Strip the first temporary mask;
15. Bake dry 130° C. for 30 minutes;
16. Dip solder.

In a modification of the FIG. 2 embodiment, strippable mask 56 could be made repellent to the seeding solutions, e.g., hydrophobic or water repellent when such solutions are aqueous, thereby avoiding the necessity of employing the second strippable mask 58.

Typical of the hydrophobic resins which could be used to form such a strippable temporary mask 54 are silicone resins, e.g., such as those disclosed in U.S. Pat. No. 2,937,976; polyethylene resins, such for example, as those disclosed in U.S. Pat. No. 3,224,094; and fluorocarbon resins (e.g., Teflon) such, for example, as those described in U.S. Pat. No. 3,203,829, polyurethane resins, acrylic resins, and the like. Such hydrophobic resins may be used alone or in combination with other resinous materials, for example, any of the resins described above for use as the insulating base.

Particularly useful hydrophobic masks may be produced by combining epoxy resins, phenol formaldehyde resins and silicone resins.

In such a modification, when the board is treated with seeding and sensitizing solutions as described herein to render the walls of the holes catalytic to the reception of electroless metal, the hydrophobic strippable mask will not be rendered catalytic to the reception of electroless metal. This is so because the temporary hydrophobic mask will not be wetted and will therefore repel the seeding solutions.

The plating on the hole walls and/or the pads or lands, need not be built up entirely by electroless metal deposition. Thus, if desired, an initial deposit of electroless metal could be followed by electroplating, if desired.

FIG. 3 illustrates such a procedure.

In FIG. 3A is shown a noncatalytic insulating base 100 clad with a thin metal film 102. In FIG. 3B, circuit pattern 104 has been imposed on the base by a standard print and etch technique. In FIG. 3C, relatively thick, permanent, nonregistered solder mask 106 has been superimposed on the circuit pattern 102.

Next, adhesive layer 108 is coated on the surface of permanent mask 106 (FIG. 3D) after which a thin metal sheet or foil, e.g., of aluminum or copper, 110, is adhered to the adhesive layer (FIG. 3E). If desired, an adhesive coated metal foil could be used, thereby eliminating the necessity of the separate adhesive coating 108 shown in FIG. 3D. Next, a hydrophobic, strippable temporary mask 112 is superimposed over the metal layer 110. Holes 114 (FIG. 3H) are then provided in designated crossover locations.

Next, the board is treated with sensitizing and seeding solutions as described herein to render the hole walls catalytic to the reception of electroless metal. Because mask 112 is hydrophobic, it will repel such solutions and thereby not be rendered catalytic.

Next, the board is contacted with or immersed in an electroless metal deposition solution to deposit a thin film of electroless metal 118 on the hole walls as shown at 118 (FIG. 3G). The base is then subjected to electroplating to build up a metal deposit 122 on the walls surrounding the holes as well as to form pads 120, as shown in FIG. 3I. The nonpermanent hydrophobic mask 112 and the metal layer 110 are then stripped. The final board has the appearance shown in FIG. 3J. It will be noted that the permanent resin mask 106 coats the entire surface on the top and bottom of the board, leaving only the plated through hole 114 with surrounding lands 120 exposed.

The procedures of FIGS. 1 and 2 could similarly be modified so as to build up the metal deposit on the hole wall by electroplating, following deposition of an initial layer of electroless metal.

In the FIG. 3 embodiment, a second, strippable temporary mask could be used as described in connection with FIG. 2, in the even that the strippable temporary mask 112 were not hydrophobic.

The invention is not limited to producing the printed circuit patterns by the so-called print and etch techniques. Thus, alternative techniques well known in the art, including the additive technique described in the applications identified hereinabove, may be used to form the printed circuit patterns.

The invention is its broader aspects is not limited to the specific steps, methods, compositions and improvements shown and described herein, but departures may be made within the scope of the accompanying claims without departing from the principles of the invention.

What is claimed:

1. In a method for manufacturing plated through hole printed circuit boards which includes establishing an insulating base having a printed circuit pattern on at least one surface, the improvement which comprises: coating the circuit pattern with a permanent, nonregistered insulating mask; adhering to the permanent mask a strippable, temporary insulating mask, establishing a hole which extends through the insulating masks into the interior of the insulating base; metallizing the insulating wall surrounding the hole, at least in part, by exposing the base to an electroless metal deposition solution; and then stripping the temporary mask so as to leave a projection of the hole wall plating exposed above the permanent insulating mask.

2. The method of claim 1 wherein metallization of the hole wall includes metallization of a portion of the surface area of the temporary mask surrounding the hole.

3. The method of claim 1 wherein the insulating base is catalytic throughout its interior to reception of electroless metal.

4. The method of claim 1 wherein the hole wall is electroplated with metal following electroless metal deposition.

5. The method of claim 1 wherein the insulating base following hole formation is treated with an aqueous solution of precious metal ions to render the hole wall catalytic to the reception of electroless metal prior to exposing the base to the electroless metal deposition solution.

6. The method of claim 5 wherein the hole wall is electroplated with metal following electroless metal deposition.

7. The improvement of claim 1 wherein the resulting board is contacted with molten solder to solder coat the metallized hole walls.

8. THe method of claim 1 wherein the temporary insulating mask is an adhesive coated polyethylene film.

9. The method of claim 1 wherein the temporary insulating mask is an adhesive coated, mechanically strippable mask.

10. In a method of manufacturing plated through hole printed circuit boards which comprises establishing an insulating base having a printed circuit pattern on at least one surface, the improvement which comprises: coating the circuit pattern with a permanent, nonregistered insulating mask; establishing a thin layer of metal on the surface of said permanent mask; superimposing a temporary, strippable adhesive coated insulating film on the thin layer of metal, providing at least one hole which extends through the masks and into the base, the wall surrounding the hole comprising a portion of said insulating base; depositing a thin layer of electroless metal on the wall surrounding the hole; electroplating additional metal on said electroless metal deposit on the hole wall; and then removing said nonpermanent mask and said thin layer of metal so as to leave a projection of the hole wall plating exposed above the permanent insulating mask.

* * * * *